(12) United States Patent
Lin et al.

(10) Patent No.: US 7,461,450 B2
(45) Date of Patent: Dec. 9, 2008

(54) METHOD FOR MAKING A HEAT DISSIPATING DEVICE

(75) Inventors: Jao-Ching Lin, Hsin-Chuang (TW);
Pei-Pei Ding, Hsin-Chuang (TW);
Hsiu-Wei Yang, Hsin-Chuang (TW);
Wen-Hwa Yu, Hsin-Chuang (TW);
Yen-Wen Chen, Hsin-Chuang (TW)

(73) Assignee: Asia Vital Components Co., Ltd. (TW)

( * ) Notice: Subject to any disclaimer, the term of this patent is extended or adjusted under 35 U.S.C. 154(b) by 540 days.

(21) Appl. No.: 11/219,001

(22) Filed: Sep. 2, 2005

(65) Prior Publication Data

US 2006/0213062 A1 Sep. 28, 2006

(30) Foreign Application Priority Data

Mar. 28, 2005 (TW) ............................... 94109573 A
Mar. 28, 2005 (TW) ............................... 94109575 A (51) Int. Cl.
*B23P 6/00* (2006.01)
(52) U.S. Cl. .............................. 29/890.032; 165/104.26
(58) Field of Classification Search .................. 29/505, 29/514, 515, 890, 890.032; 165/104.26, 165/105, 104.21
See application file for complete search history.

(56) References Cited

U.S. PATENT DOCUMENTS

| 6,293,333 | B1 * | 9/2001 | Ponnappan et al. | 165/104.26 |
| 6,508,302 | B2 * | 1/2003 | Ishida et al. | 165/104.26 |
| 6,725,910 | B2 * | 4/2004 | Ishida et al. | 165/104.26 |
| 2005/0022975 | A1 * | 2/2005 | Rosenfeld et al. | 165/104.11 |

\* cited by examiner

*Primary Examiner*—Ryan J Walters
(74) *Attorney, Agent, or Firm*—Ostrolenk, Faber, Gerb & Soffen, LLP (57) ABSTRACT

A method for making a heat dissipating device includes the steps of: preparing a container body that has a fluid passage and opposite upper and lower walls, the fluid passage being in fluid communication with an inner space in the container body; vacuuming the inner space through the fluid passage; filling the inner space with a predetermined amount of a working fluid through the fluid passage; and depressing a wall portion of a selected one of the upper and lower walls in such a manner that the depressed wall portion is deformed toward the other of the upper and lower walls so as to form a depression in the selected one of the upper and lower walls, and so as to form a sealing mechanism that functions to isolate the fluid passage from the inner space.

3 Claims, 12 Drawing Sheets

FIG. 22

METHOD FOR MAKING A HEAT DISSIPATING DEVICE

CROSS-REFERENCE TO RELATED APPLICATIONS

This application claims priority of Taiwanese application Nos. 094109575 and 094109573, both filed on Mar. 28, 2005.

BACKGROUND OF THE INVENTION

1. Field of the Invention

This invention relates to a method for making a heat dissipating device, more particularly to method for making a heat dissipating device including a container body with a wick structure and a working fluid therein.

2. Description of the Related Art

Figure 1:
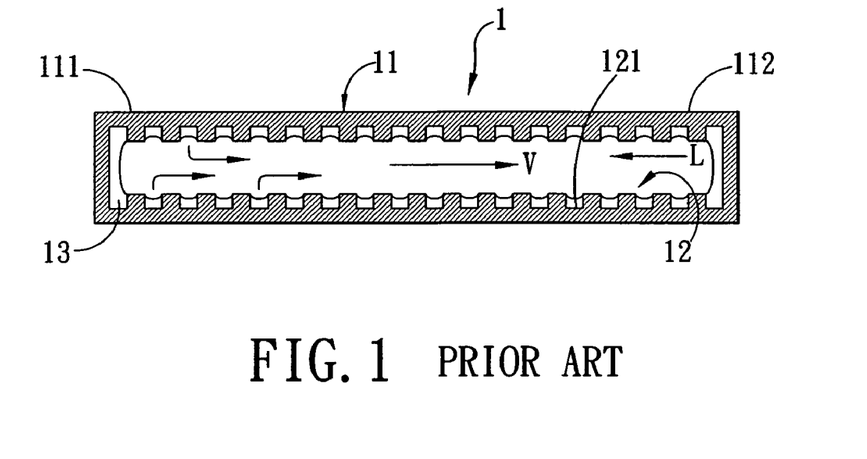
FIG. 1 is a sectional view of a conventional heat dissipating device.

FIG. 1 illustrates a conventional heat dissipating device, which is a flat plate-type heat pipe, useful for dissipating heat resulting from operation of an electronic component, such as a CPU, attached thereto. The heat dissipating device includes a container 1 with a container body 11 made from a metal and having heating and cooling ends 111, 112, a wick structure 12 formed in the container body 11, and a working fluid 13 filled in the container body 11. The wick structure 12 is formed with a network of capillaries 121. In use, the working fluid 13 at the heating end 111 is vaporized upon absorbing heat from the electronic component. The vapor thus formed flows from the heating end 111 toward the cooling end 112, and is subsequently condensed thereat, which, in turn, results in a liquid flow from the cooling end 112 toward the heating end 111 by virtue of the capillary mechanism of the capillaries 121 of the wick structure 12, thereby enabling automatic circulation of the working fluid 13 in the container body 11.

Since the liquid-vapor balance of the working fluid 13 in the container body 11 is critical to efficient heat dissipation, it is required that there be substantially no presence of air in the container body 11.

Figure 2:
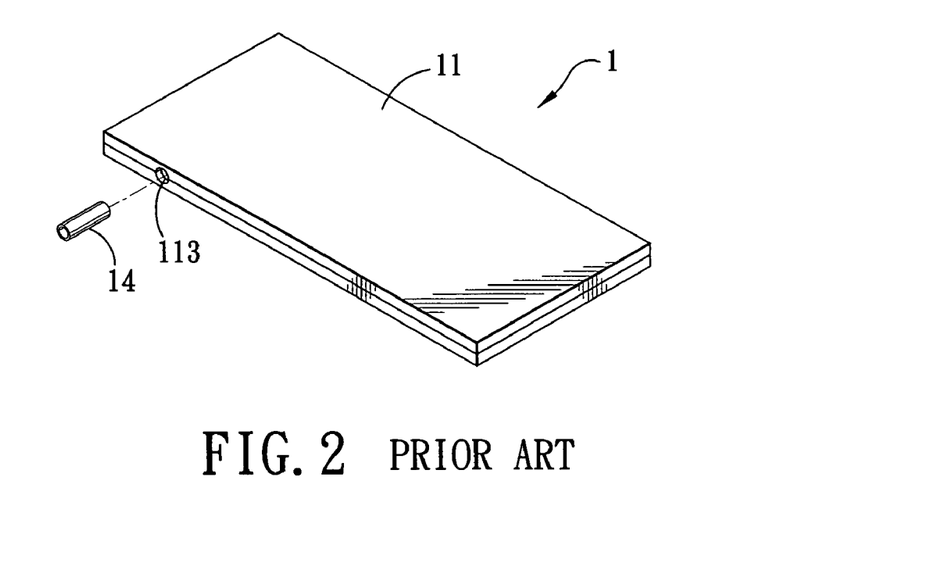
FIGS. 2 to 4 illustrate consecutive steps of a conventional method for making the heat dissipating device of FIG. 1.
Figure 3:
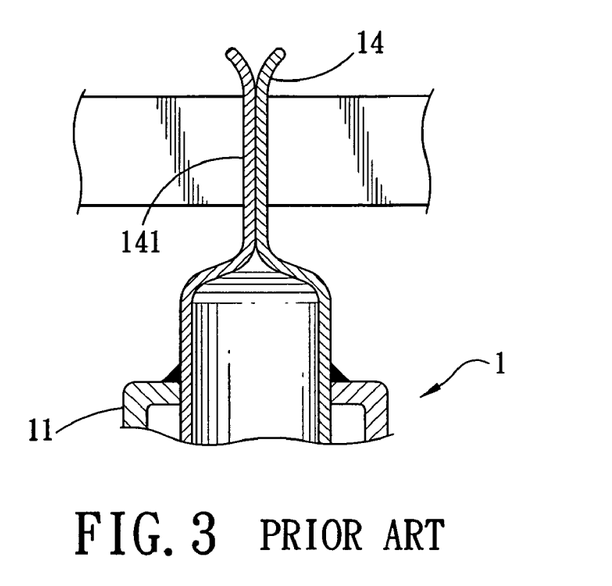
Figure 4:
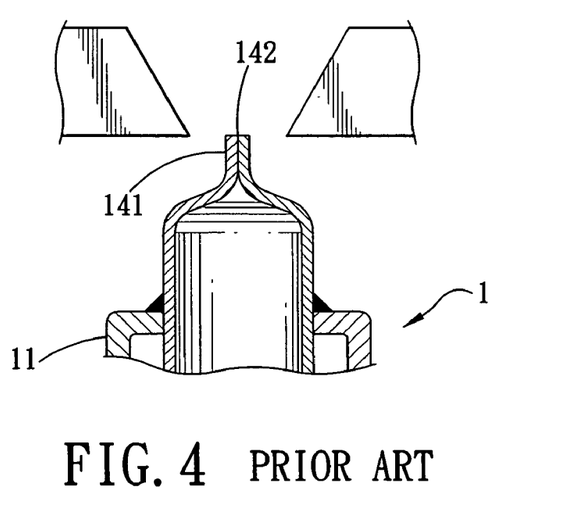

FIGS. 2 to 4 illustrate a conventional method for making the heat dissipating device. The method includes the steps of inserting a tube 14 into an opening 113 in the container body 11, sealing a clearance around the tube 14 by welding techniques, vacuuming the container body 11 through the tube 14, filling the container body 11 with the working fluid 13 through the tube 14, deforming the tube 14 to form a closure 141 so as to provide a temporary sealing for preventing air from entering into the container body 11, and immediately cutting the tube 14 such that the closure 141 remains on the container body 11 and then sealing an outer end 142 of the closure 141 with a sealing material.

Since the temporary sealing effect provided by the closure 141 thus formed is poor, air may enter into the container body 11 through slits formed in the closure 141 prior to the sealing operation of the closure 141, thereby adversely affecting the vapor-liquid balance of the working fluid 13 in the container body 11. As a consequence, the sealing operation is required to be conducted at the same apparatus where the deforming and sealing operations are performed, which considerably increases the cost of the apparatus.

SUMMARY OF THE INVENTION

The object of the present invention is to provide a method for making a heat dissipating device that is capable of overcoming the aforesaid drawbacks of the prior art.

According to one aspect of the present invention, there is provided a method for making a heat dissipating device. The method comprises the steps of: preparing a container body that defines an inner space therein and that has opposite heating and cooling ends, a fluid passage disposed between the heating and cooling ends, and opposite upper and lower walls extending from the heating end to the cooling end, the container body being provided with a wick structure that is mounted in the inner space and that extends from the heating end to the cooling end, the fluid passage being in fluid communication with the inner space; vacuuming the inner space through the fluid passage; filling the inner space with a predetermined amount of a working fluid through the fluid passage; and depressing a wall portion of a selected one of the upper and lower walls in such a manner that the depressed wall portion is deformed toward the other of the upper and lower walls so as to form a depression in the selected one of the upper and lower walls, and so as to form a sealing mechanism that functions to isolate the fluid passage from the inner space.

According to another aspect of this invention, there is provided a method for making a heat dissipating device. The method comprises the steps of: preparing a container body that defines an inner space therein and that has opposite heating and cooling ends, an opening disposed between the heating and cooling ends, and opposite upper and lower walls extending from the heating end to the cooling end, the container body being provided with a wick structure that is mounted in the inner space and that extends from the heating end to the cooling end, the opening being in fluid communication with the inner space; inserting sealingly a tube into the opening so as to establish a fluid path to communicate with the inner space; vacuuming the inner space in the container body through the fluid path; filling the inner space in the container body with a predetermined amount of a working fluid through the fluid path; and depressing a wall portion of said one of the upper and lower walls in such a manner that the depressed wall portion is deformed toward the other of the upper and lower walls so as to form a depression in said one of the upper and lower walls, and so as to form a sealing mechanism that functions to isolate the fluid passage from the inner space.

BRIEF DESCRIPTION OF THE DRAWINGS

Other features and advantages of the present invention will become apparent in the following detailed description of the preferred embodiments of the invention, with reference to the accompanying drawings, in which.

DETAILED DESCRIPTION OF THE PREFERRED EMBODIMENTS

Before the present invention is described in greater detail, it should be noted that same reference numerals have been used to denote like elements throughout the specification.

Figure 5:
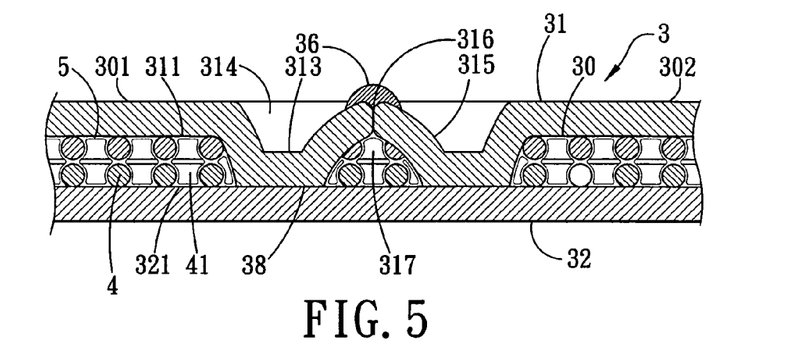
FIG. 5 is a sectional view of the first preferred embodiment of a heat dissipating device according to this invention.

FIG. 5 illustrates the first preferred embodiment of a flat plate-type heat dissipating device according to the present invention. The heat dissipating device is useful for dissipating heat resulting from operation of electronic components, such as a CPU.

The heat dissipating device includes: a container body 3 defining an inner space 30 therein, and having opposite heating and cooling ends 301, 302, a fluid passage 316 disposed between the heating and cooling ends 301, 302, and opposite flat upper and lower walls 31, 32 extending from the heating end 301 to the cooling end 302, each of the upper and lower walls 31, 32 having an inner surface 311, 321; a working fluid 5 received in the inner space 30 in the container body 3; a wick structure 4 mounted in the inner space 30 in the container body 3 and extending from the heating end 301 to the cooling end 302 to permit liquid flow from the cooling end 301 to the heating end 302 of the container body 3 by virtue of capillary mechanism when a vapor flow resulting from heating of the working fluid 5 at the heating end 301 flows to the cooling end 302 of the container body 3; and a sealing material 36 that seals the fluid passage 316. One of the upper and lower walls 31, 32, i.e., the upper wall 31, has a wall portion 313 that is disposed adjacent to the fluid passage 316 and that is depressed to form a first depression 314 indented inwardly of the inner space 30 in such a manner that the depressed wall portion 313 of said one of the upper and lower walls 31, 32 cooperates with the other of the upper and lower walls 31, 32 to form a sealing mechanism 38 that functions to isolate the fluid passage 316 from the inner space 30.

In this embodiment, the upper wall 31 is further formed with a bulging wall portion 315 that is surrounded by the depressed wall portion 313 and that protrudes into the first depression 314. The fluid passage 316 is formed in the bulging wall portion 315, and is deformed into a slit, which is sealed by the sealing material 36, after the depression operation of the upper wall 31. The bulging wall portion 315 of the upper wall 31 cooperates with the lower wall 32 to define a cavity 317 therebetween. The first depression 314 is looped in shape, and is preferably annular in shape. Each of the upper and lower walls 31, 32 is in the form of a flat plate.

Figure 6:
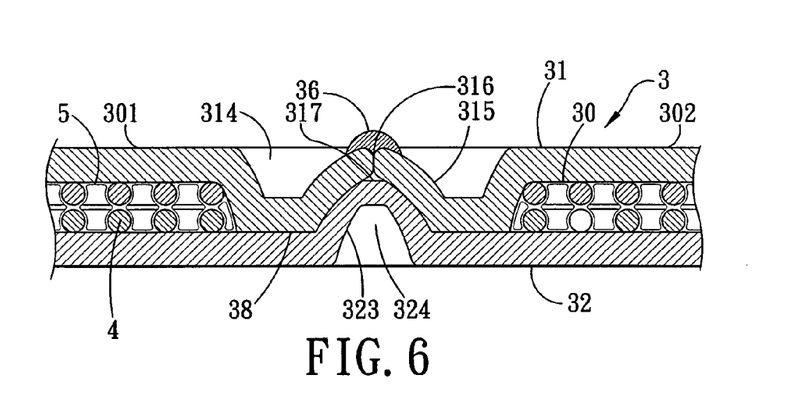
FIG. 6 is a fragmentary sectional view of the second preferred embodiment of a heat dissipating device according to this invention.

FIG. 6 illustrates the second preferred embodiment of the heat dissipating device according to this invention. The heat dissipating device of this embodiment differs from the previous embodiment in that the lower wall 32 has a wall portion 323 that is depressed to form a second depression 324 opposite to the first depression 314. The depressed wall portion 323 of the lower wall 32 protrudes into the cavity 317.

In this embodiment, the depressed wall portion 323 of the lower wall 32 conforms to the bulging wall portion 315 of the upper wall 31 to form the sealing mechanism 38 therewith.

Figure 7:
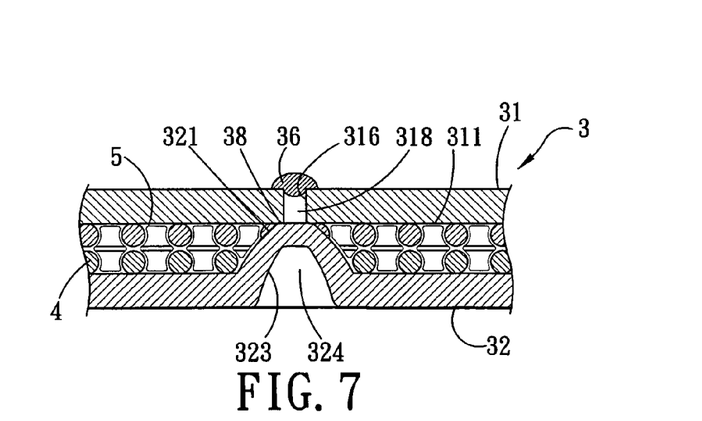
FIG. 7 is a fragmentary sectional view of the third preferred embodiment of a heat dissipating device according to this invention.

FIG. 7 illustrates the third preferred embodiment of the heat dissipating device according to this invention. The heat dissipating device of this embodiment differs from the first preferred embodiment in that the first depression 324 is formed in the lower wall 32 and that the fluid passage 316 in the upper wall 31 is in the form of an opening 318 which is sealingly covered by the inner surface 321 of the lower wall 32 at the depressed wall portion 323. The inner surface 321 of the lower wall 32 at the depressed wall portion 323 cooperates with the inner surface 311 of the upper wall 31 at the periphery of the opening 318 to define the sealing mechanism 38.

The opening 318 in the upper wall 31 is sealed by the sealing material 36 using welding techniques.

Figure 8:
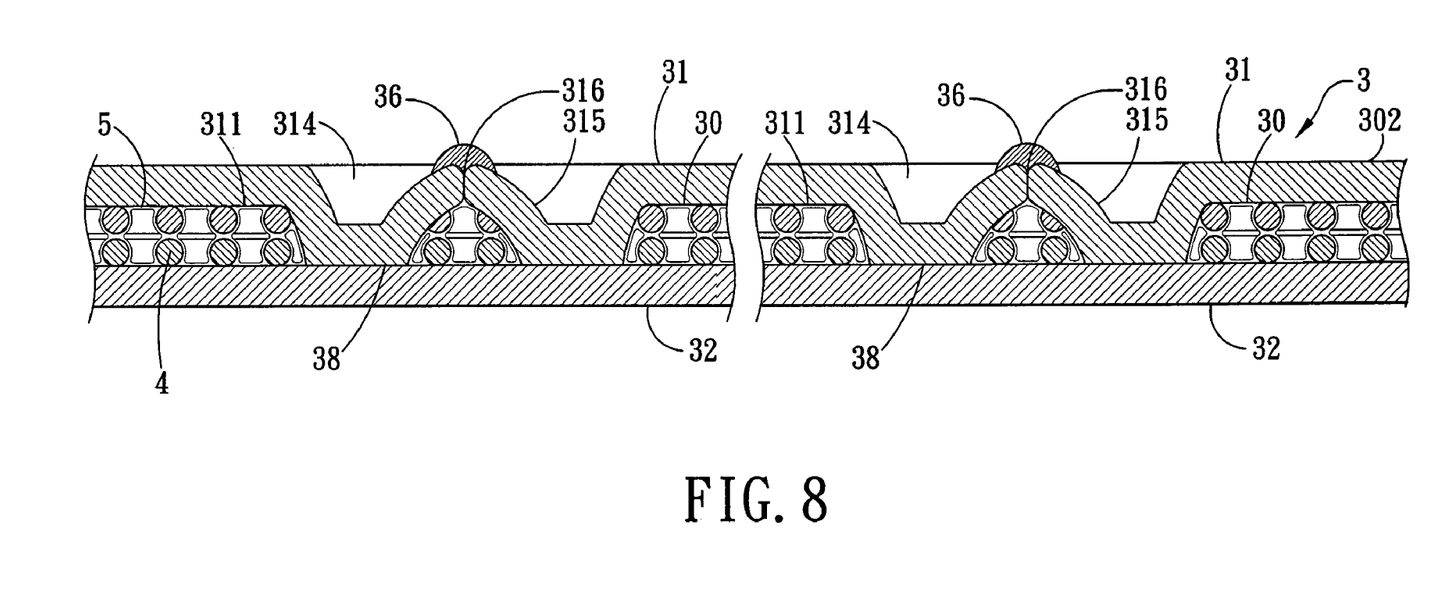
FIG. 8 is a fragmentary sectional view of the fourth preferred embodiment of a heat dissipating device according to this invention.
Figure 9:
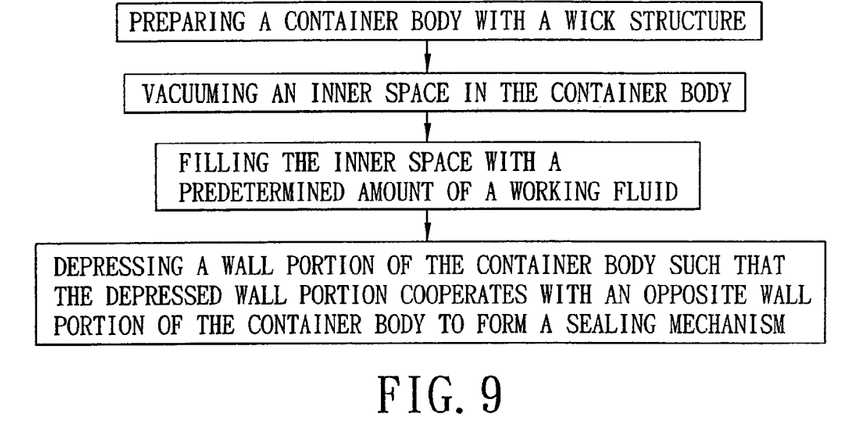
FIG. 9 is a flow chart illustrating consecutive steps of a method for making the heat dissipating device of the first preferred embodiment.
Figure 10:
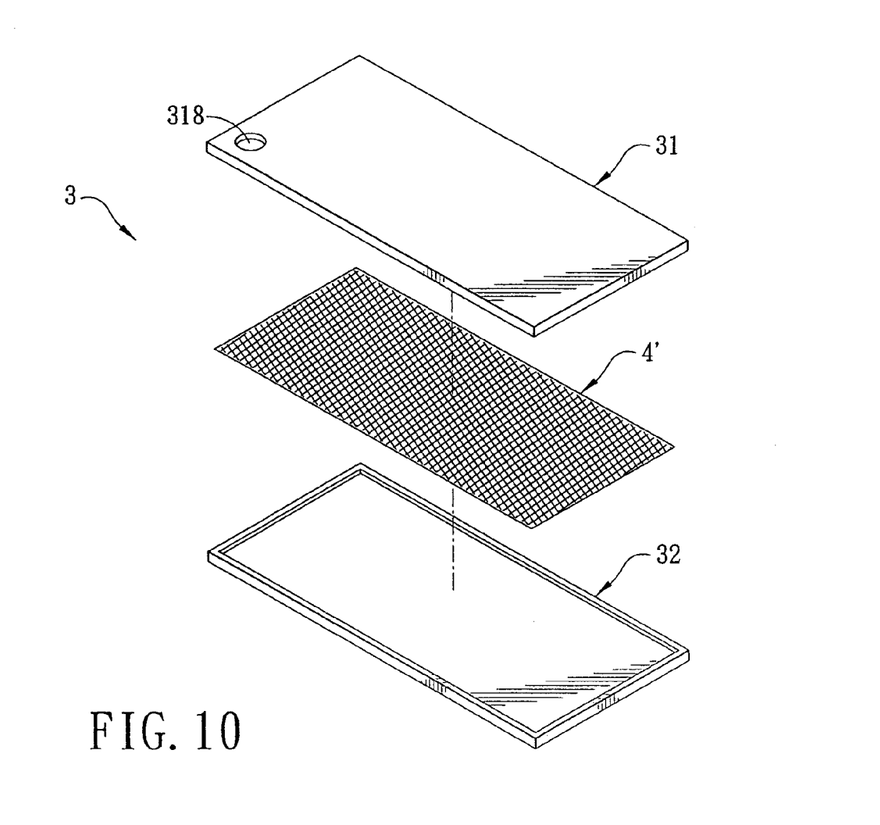
FIG. 10 is an exploded perspective view to illustrate how a wick structure is mounted in a container body according to the method of this invention.
Figure 11:
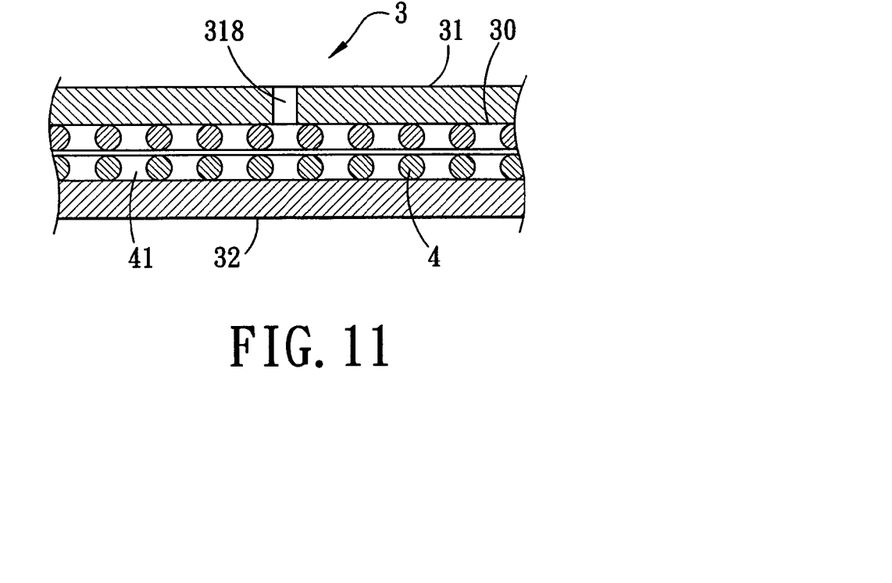
FIG. 11 is a fragmentary sectional view to illustrate the configuration of the wick structure of the heat dissipating device of this invention.
Figure 12:
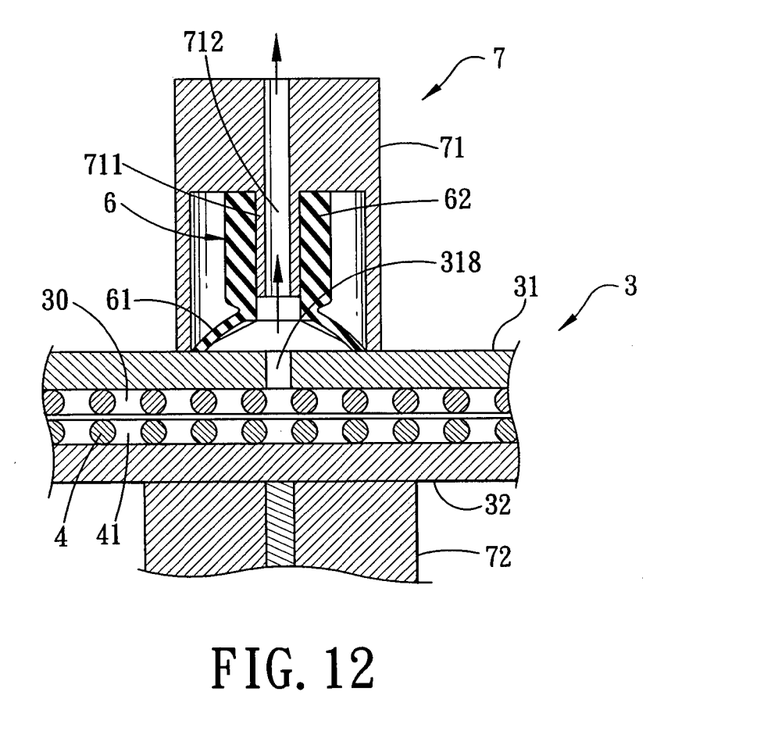
FIG. 12 is a fragmentary sectional view to illustrate how the container body is to be connected to a vacuuming device using a vacuum-connecting member according to the method of this invention.
Figure 13:
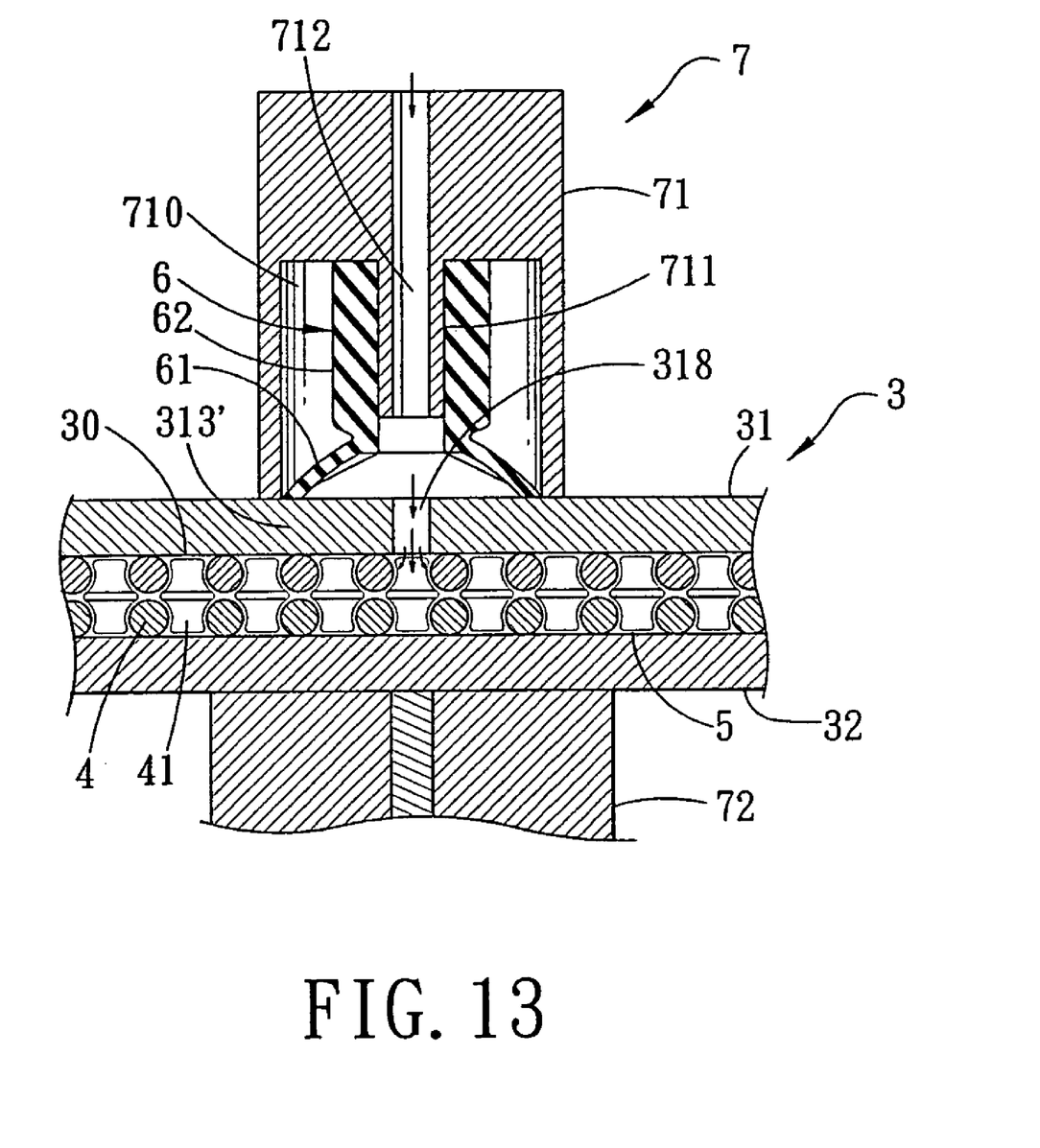
FIG. 13 is a fragmentary sectional view to illustrate how the container body is filled with a working fluid using the vacuum-connecting member according to the method of this invention.

FIG. 8 illustrates the fourth preferred embodiment of the heat dissipating device according to this invention. The heat dissipating device of this embodiment differs from the first preferred embodiment in that the upper wall 31 further has a second fluid passage 316 that is disposed between the heating and cooling ends 301, 302 of the container body 3, and a second wall portion 313 that is disposed adjacent to the second fluid passage 316 and that is depressed to form a second depression 314 indented inwardly of the inner space 30 in such a manner that the depressed wall portion 313 of the upper wall 31 cooperates with the lower wall 31 to form a second sealing mechanism 38 that functions to isolate the second fluid passage 316 from the inner space 30.

The container body 3 of the preferred embodiments is preferably made from a metal selected from the group consisting of copper and aluminum.

FIGS. 9 to 14, in combination with FIG. 5, illustrate consecutive steps of the preferred embodiment of a method for making the heat dissipating device of the first preferred embodiment.

The method includes the steps of: preparing the container body 3 by assembling the upper and lower walls 31, 32 together (see FIGS. 10 and 11), and mounting a screen member 4' in the container body 3 to form the wick structure 4 that is connected to the upper and lower walls 31, 32 and that has a network of capillaries 41, the upper wall 31 being formed with the opening 318 that defines the fluid passage 316 and that is in fluid communication with the inner space 30; vacuuming the inner space 30 in the container body 3 (see FIG. 12) through the opening 318 using a vacuum-connecting member 6 that sealingly covers a periphery of the opening 318 and a vacuuming device (not shown) connected to the vacuum-connecting member 6; filling the inner space 30 in the container body 3 with a predetermined amount of the working fluid 5 through the opening 318 (see FIG. 13); depressing a wall portion 313' (see FIG. 13) of the upper wall 31 using a hydraulic depressing device 7 (see FIG. 14) in such a manner that the opening 318 is deformed into the slit and that the depressed wall portion 313 is deformed toward the lower wall 32 (see FIG. 14), thereby forming the bulging wall portion 315, the first depression 314, and the sealing mechanism 38 that isolates the inner space 30 from the slit; and sealing the thus formed slit in the bulging wall portion 315 with the sealing material 36 (see FIG. 5) using welding techniques.

Figure 14:
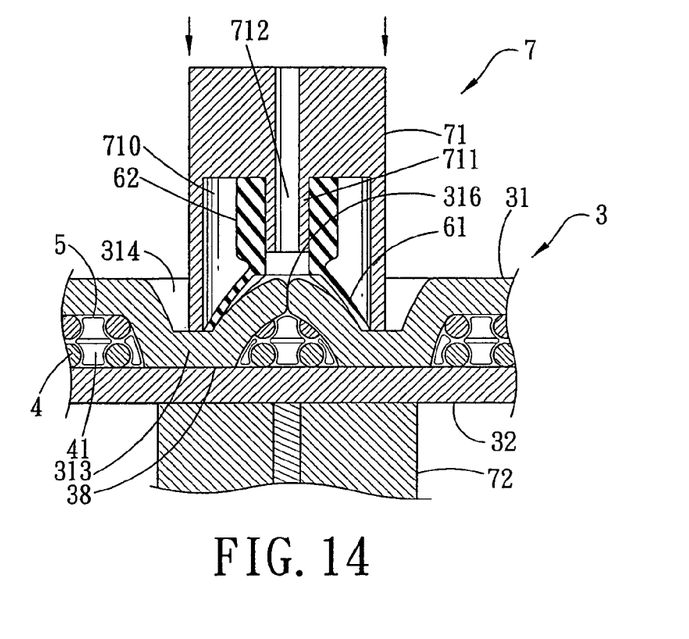
FIG. 14 is a fragmentary sectional view to illustrate how a depression is formed in an upper wall of the container body of the first preferred embodiment using a pressing device according to the method of this invention.

The pressing device 7 includes upper and lower pressing members 71, 72. The upper pressing member 71 defines an accommodating space 710, and has an open end that abuts against the upper wall 31 of the container body 3, and a tube part 711 that extends into the accommodating space 710 and that defines a fluid path 712 therein. The lower pressing member 72 abuts against the lower wall 32 and remains stationary, while the upper pressing member 71 is operated to move downwardly to depress the upper wall 31 to form the first depression 314 during the depressing operation. The vacuum-connecting member 6 is disposed in the accommodating space 710 in the upper pressing member 71, and includes a deformable funnel-shaped part 61 that covers sealingly the periphery of the opening 318, and a sleeve part 62 that extends from the funnel-shaped part 61 and that is sleeved on the tube part 711. Air in the container body 3 is withdrawn through the opening 318 and the fluid path 712 during the vacuuming operation. The working fluid 5 is supplied from a source (not shown), and flows into the container body 3 through the fluid path 712 and the opening 318 after the container body 3 is vacuumed.

Figure 15:
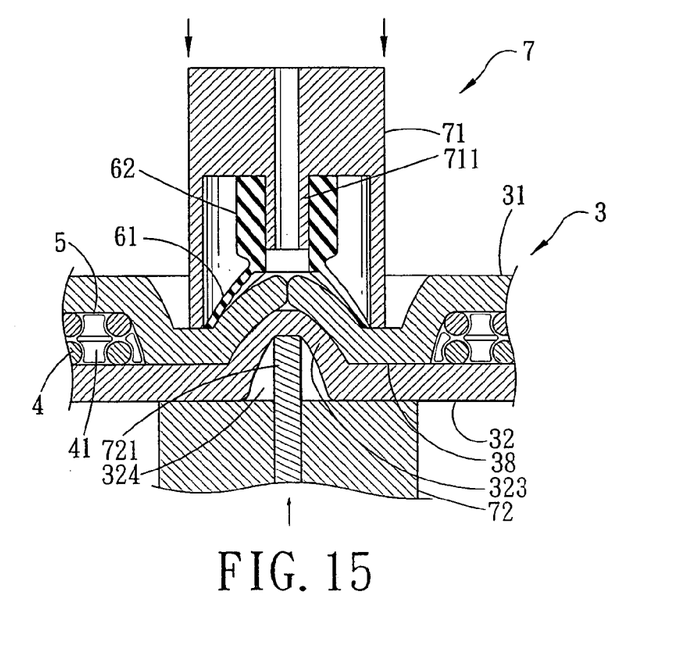
FIG. 15 is a fragmentary sectional view to illustrate how first and second depressions are respectively formed in the upper and lower walls of the container body of the second preferred embodiment using the pressing device according to the method of this invention.

Referring to FIG. 15, in combination with FIG. 6, the method for making the heat dissipating device of the second preferred embodiment is similar to that of the first preferred embodiment, except that the lower wall 32 is also depressed by a plunger 721 of the lower pressing member 72 so as to form the second depression 324 and the depressed wall portion 323 of the lower wall 32.

Figure 16:
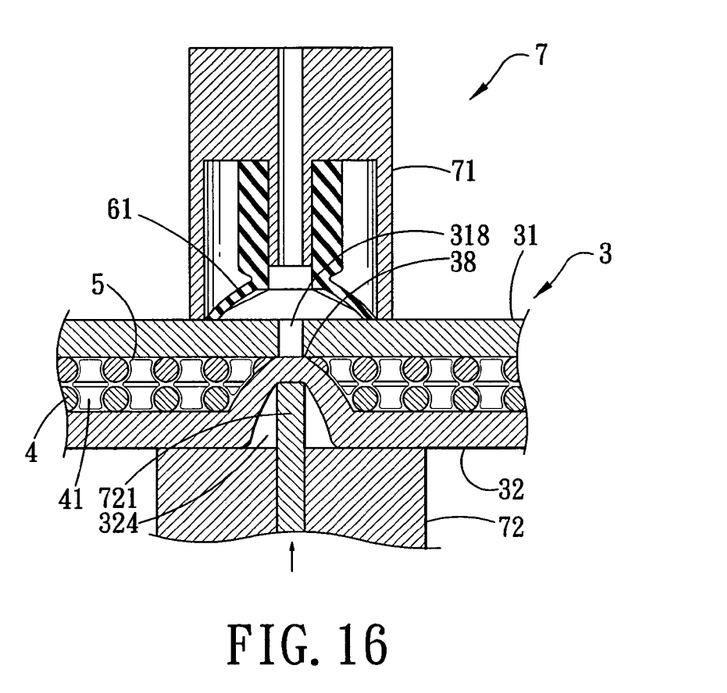
FIG. 16 is a fragmentary sectional view to illustrate how a depression is formed in the lower wall of the container body of the third preferred embodiment using the pressing device according to the method of this invention.

Referring to FIG. 16, in combination with FIG. 7, the method for making the heat dissipating device of the third preferred embodiment differs from that of the first preferred embodiment in that only the lower wall 32 is depressed by the plunger 721 of the lower pressing member 72 while the upper pressing member 71 remains stationary so as to form the first depression 324 and the depressed wall portion 323 of the lower wall 32.

Figure 17:
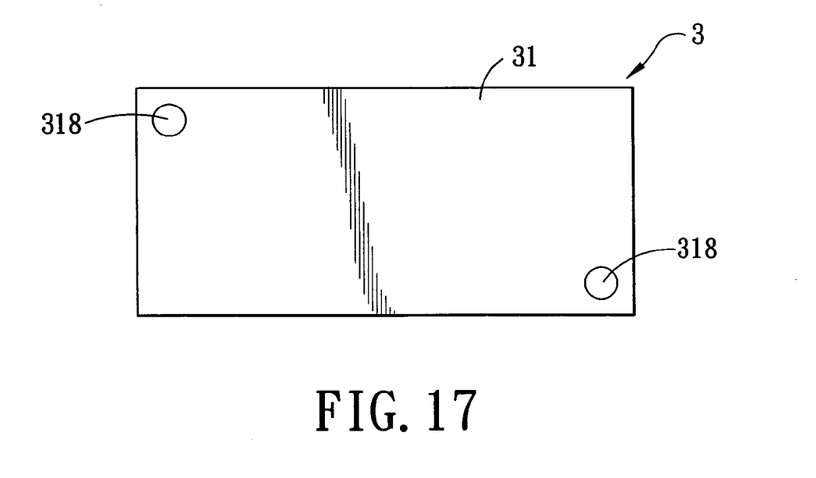
FIG. 17 is a schematic view of illustrate the configuration of an upper wall of the container body of the fifth preferred embodiment.
Figure 18:
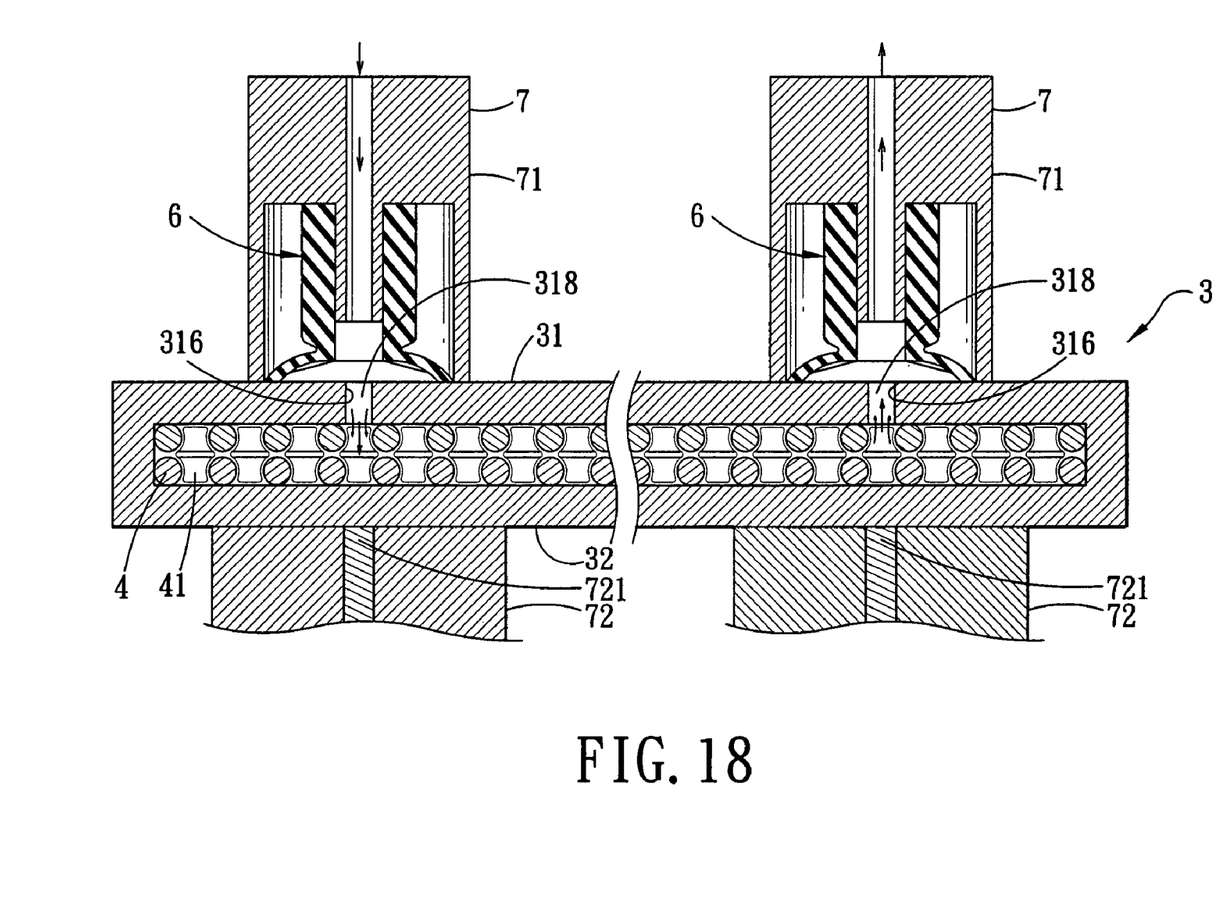
FIG. 18 is a fragmentary sectional view to illustrate how two depressions are formed in the upper wall of the container body of the fourth preferred embodiment using two of the pressing devices according to the method of this invention.

Referring to FIGS. 17 and 18, in combination with FIG. 8, the method for making the heat dissipating device of the fourth preferred embodiment differs from that of the first preferred embodiment in that the upper wall 31 is further formed with a second opening 318 that defines the second fluid passage 316 (see FIG. 17) and further has a wall portion that is depressed by a second pressing device 7 (see FIG. 18) to form the second depression 314. A second vacuum-connecting member 6 is provided to cover the second opening 318. One of the fluid passages 316 is connected to the vacuum pump (not shown), while the other of the fluid passages 316 is connected to the working fluid supply (not shown). Hence, the vacuuming and filling operations can be conducted simultaneously, and the first and second depressions 314 can be formed at the same time, thereby accelerating production rate of the heat dissipating device.

Figure 19:
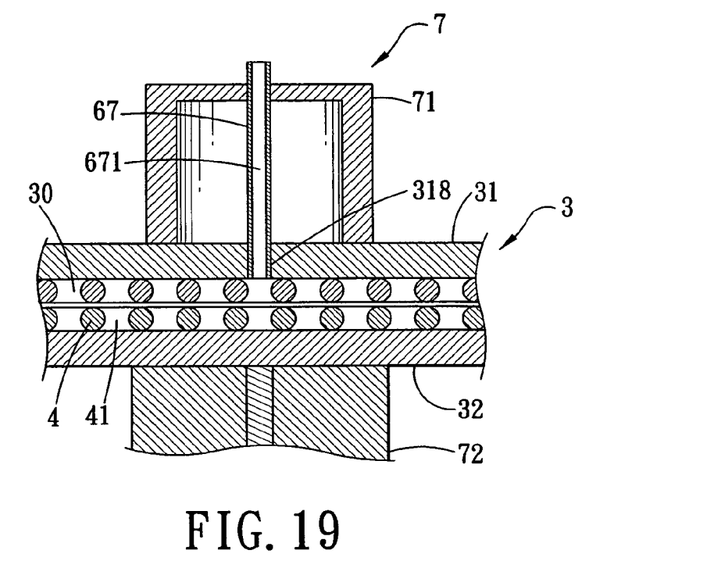
FIGS. 19 and 20 are fragmentary sectional views to illustrate how a depression is formed in an upper wall of the container body of the fifth preferred embodiment using the pressing device according to another method of this invention.
Figure 20:
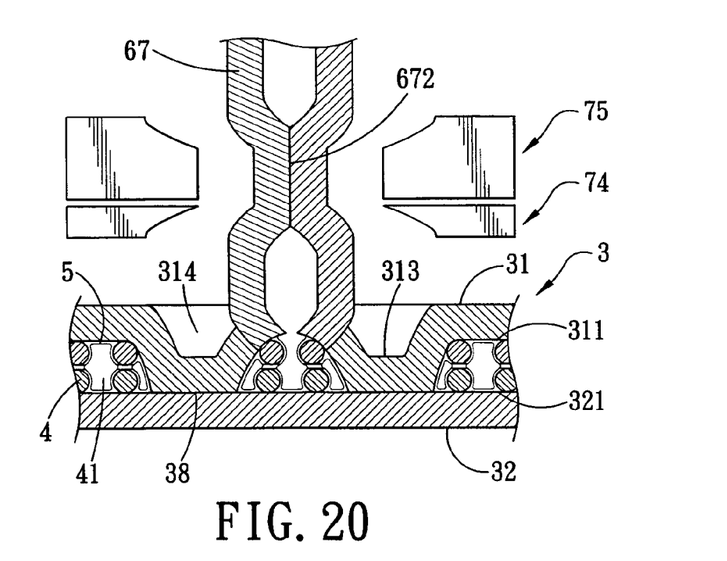

FIGS. 19 and 20 illustrate how the fifth preferred embodiment of the heat dissipating device of this invention is made according to another method of this invention.

The method for making the fifth preferred embodiment includes the steps of: preparing the container body 3; inserting sealingly a tube 67 into the opening 318 (see FIG. 19) so as to establish a fluid path 671 to communicate with the inner space 30; vacuuming the inner space 30 in the container body 3 through the fluid path 671; filling the inner space 30 in the container body 3 with a predetermined amount of a working fluid 5 through the fluid path 671; depressing a wall portion of the upper wall 31 (see FIG. 20) in such a manner that the depressed wall portion 313 is deformed toward the lower wall 32 so as to form the first depression 314 in the upper wall 31, and so as to form the sealing mechanism 38, thereby isolating the fluid path 671 from the inner space 30; deforming the tube 67 to form a closure 672 for blocking the fluid path 671 using a pressing tool 75; cutting the tube 67 using a cutter 74 in such a manner that a segment of the tube 67 having the closure 671 remains on the container body 3; and sealing an outer end of the closure 672 (not shown) with the sealing material (not shown).

Figure 21:
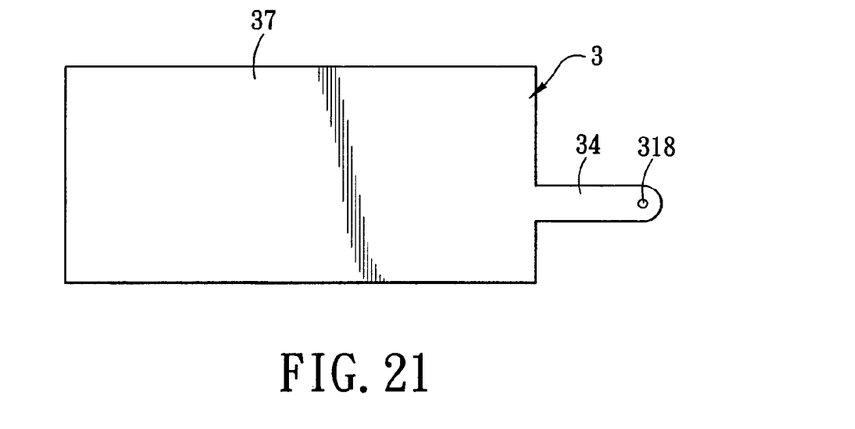
FIG. 21 is a schematic view to illustrate the configuration of a container body employed for the preparation of the sixth preferred embodiment of the heat dissipating device according to this invention.
Figure 22:
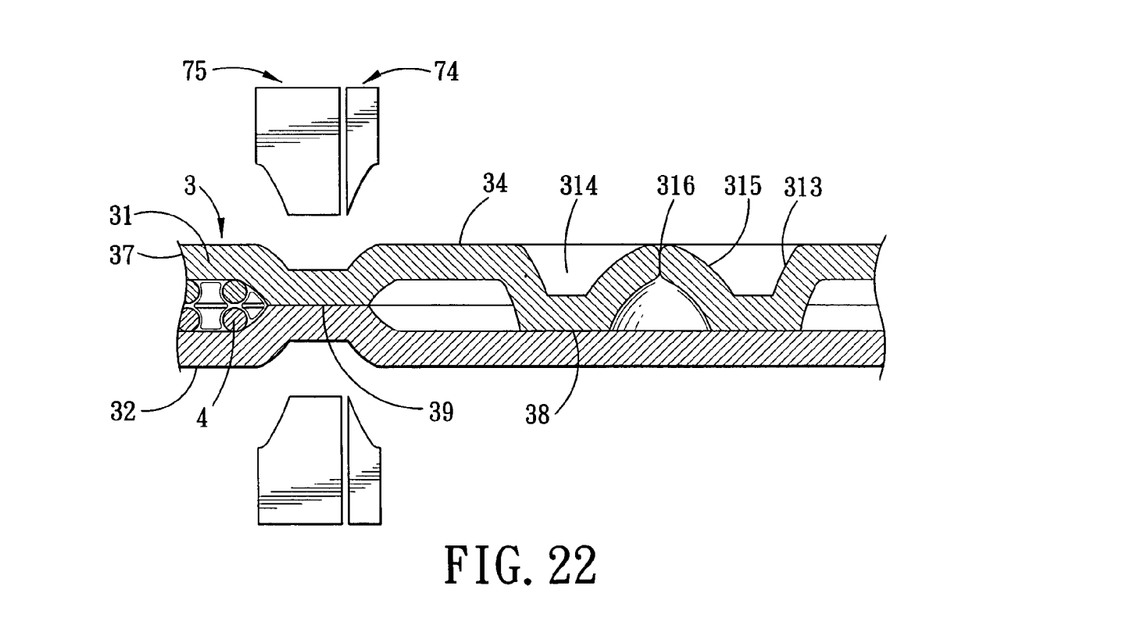
FIG. 22 is a fragmentary sectional view to illustrate how the sixth preferred embodiment is formed according to this invention.

FIGS. 21 and 22 illustrate how the sixth preferred embodiment of the heat dissipating device of this invention is made according to another method of this invention.

The container body 3 of the heat dissipating device of this embodiment has a main part 37 and an extension 34 reduced in cross-section from the main part 37. The upper and lower walls 31, 32 of the container body 3 extend from the main part 37 to the extension 34. The wick structure 4 extends within the main part 37. The upper wall 31 is formed with the opening 318 at the extension 34. The first depression 314 is formed in the upper wall 31 at the extension 34 by depressing the extension 34 at a pressing station using a pressing device (not shown), thereby forming the slit and the sealing mechanism 38 at the extension 34. Since the sealing mechanism 38 provides a sufficient temporary sealing effect after filling of the working fluid 5 and prior to sealing with the sealing material 36, the depressed extension 34 together with the main part 37 can be transferred from the pressing station to another station for a second pressing and cutting operation using a pressing tool 75 and a cutter 74 without suffering from the aforesaid drawback as encountered in the prior art. The second pressing operation forms a closure 39 adjacent to the main part 37. The extension 34 is cut after the second pressing operation in such a manner that a segment of the extension 34 with the closure 39 remains on the main part 37. An outer end of the closure 39 is then sealed by the sealing material (not shown).

With the inclusion of the depressed wall portion 313 of the upper wall 31 and/or the depressed wall portion 323 of the lower wall 32 in the heat dissipating device of this invention, the aforesaid drawbacks of the prior art can be eliminated, and a desired vapor-liquid balance of the working fluid 5 in the container body 3 can be achieved.

While the present invention has been described in connection with what is considered the most practical and preferred embodiments, it is understood that this invention is not limited to the disclosed embodiments but is intended to cover various arrangements included within the spirit and scope of the broadest interpretations and equivalent arrangements.

We claim:

1. A method for making a heat dissipating device, comprising: preparing a container body that defines an inner space therein and that has opposite heating and cooling ends, a fluid passage disposed between the heating and cooling ends, and opposite upper and lower walls in the form of a flat plate and extending from the heating end to the cooling end, the container body being provided with a wick structure that is mounted in the inner space and that extends from the heating end to the cooling end, the fluid passage being in fluid communication with the inner space;

vacuuming the inner space through the fluid passage;

filling the inner space with a predetermined amount of a working fluid through the fluid passage; and depressing a wall portion of a selected one of the upper and lower walls in such a manner that the depressed wall portion is deformed toward the other of the upper and lower walls so as to form a first depression in the selected one of the upper and lower walls, and so as to form a sealing mechanism that functions to isolate the fluid passage from the inner space;

the fluid passage is formed in the other of the upper and lower walls, and is covered by the depressed wall portion of the selected one of the upper and lower walls.

2. The method of claim 1, further comprising sealing the fluid passage with a sealing material.

3. The method of claim 1, wherein the selected one of the upper and lower walls is formed with a bulging wall portion that protrudes into the first depression, and the fluid passage is formed in the bulging wall portion and is deformed into a slit during the depressing operation, the method further comprising depressing the other of the upper and lower walls in such a manner that the depressed wall portion of the other of the upper and lower walls protrudes into a cavity defined by the bulging wall portion of the selected one of the upper and lower walls.

* * * * *